(12) United States Patent
Cheng et al.

(10) Patent No.: US 7,728,371 B2
(45) Date of Patent: Jun. 1, 2010

(54) SOI CMOS COMPATIBLE MULTIPLANAR CAPACITOR

(75) Inventors: Kangguo Cheng, Beacon, NY (US); Louis C Hsu, Fishkill, NY (US); Jack A. Mandelman, Flat Rock, NC (US); William Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 11/857,770

(22) Filed: Sep. 19, 2007

(65) Prior Publication Data

US 2009/0072290 A1 Mar. 19, 2009

(51) Int. Cl.
*H01L 27/108* (2006.01)

(52) U.S. Cl. ............................. 257/301; 257/E27.092; 438/243

(58) Field of Classification Search .................. 438/243; 257/300, 301, E21.396, E21.647, E27.092, 257/E27.093, E29.346

See application file for complete search history.

(56) References Cited

U.S. PATENT DOCUMENTS

| | | | |
|---|---|---|---|
| 5,759,907 A | 6/1998 | Assaderaghi et al. | |
| 5,770,875 A | 6/1998 | Assaderaghi et al. | |
| 6,057,188 A | 5/2000 | El-Kareh et al. | |
| 6,867,450 B2 * | 3/2005 | Kito et al. | 257/301 |

* cited by examiner

*Primary Examiner*—David Vu
(74) *Attorney, Agent, or Firm*—Scully, Scott, Murphy & Presser, P.C.; Steven Capella, Esq.

(57) ABSTRACT

An isolated shallow trench isolation portion is formed in a top semiconductor portion of a semiconductor-on-insulator substrate along with a shallow trench isolation structure. A trench in the shape of a ring is formed around a doped top semiconductor portion and filled with a conductive material such as doped polysilicon. The isolated shallow trench isolation portion and the portion of a buried insulator layer bounded by a ring of the conductive material are etched to form a cavity. A capacitor dielectric is formed on exposed semiconductor surfaces within the cavity and above the doped top semiconductor portion. A conductive material portion formed in the trench and above the doped top semiconductor portion constitutes an inner electrode of a capacitor, while the ring of the conductive material, the doped top semiconductor portion, and a portion of a handle substrate abutting the capacitor dielectric constitute a second electrode.

13 Claims, 18 Drawing Sheets

SOI CMOS COMPATIBLE MULTIPLANAR CAPACITOR

FIELD OF THE INVENTION

The present invention generally relates to semiconductor devices for integrated circuits, and particularly to a semiconductor-on-insulator (SOI) complementary metal oxide semiconductor (CMOS) process compatible capacitor having multiplanar capacitor surfaces and methods of manufacturing the same.

BACKGROUND OF THE INVENTION

Semiconductor-on-insulator (SOI) devices are increasingly employed in high performance integrated circuits for superior performance to bulk semiconductor devices. As the operating frequency of integrated circuits exceeds 1 gigahertz (GHz) with continued scaling of semiconductor devices, on-chip capacitors having a large capacitance are increasingly relied upon to maintain reliable functionality of high frequency integrated circuits. For example, decoupling capacitors are widely used in state-of-the art high frequency integrated circuits to suppress a voltage fluctuation in a power supply network during high speed switching operations. Another exemplary application of on-chip capacitors is the emerging system-on-chip (SoC) technology in which digital, analog, and passive semiconductor devices are integrated on the same chip to provide enhanced functionality. A small fluctuation in voltage or current of an electrical signal in such circuits may cause severe performance degradation, or even detrimental system malfunction. Using on-chip capacitors as a charge reservoir can prevent or minimize such undesired signal fluctuations.

Several prior art methods are known for fabricating capacitors with a high capacitance on an SOI substrate. In one prior art method, a conventional planar capacitor is employed in which the capacitance of the planar capacitor is increased by simply increasing the area of the capacitor. This method has the advantage of incurring a low processing cost because planar capacitors can be fabricated simultaneously with logic devices by using a conventional CMOS processing sequence. However, a large surface area is occupied by these planar capacitors, resulting in a low device density and a large chip size, which decreases chip yield and may eventually increase cost if a large number of planar capacitors are employed in the integrated circuit.

Another prior art method provides deep trench capacitors, which enable a high-capacitance without requiring a large surface area. The deep trench capacitors employ deep trenches formed in a semiconductor substrate prior to formation of standard complementary metal oxide semiconductor (CMOS) devices. Methods of forming deep trench capacitors are well known in the art. Co-assigned U.S. Pat. No. 6,057,188 to El-Kareh et al. and U.S. Pat. Nos. 5,770,875 and 5,759,907 to Assaderaghi et al., which provide deep trench capacitors on an SOI substrate and methods of manufacturing the same, are incorporated herein by reference.

Although deep trench capacitors have the advantage of providing high capacitance capacitors at a high areal density, this approach has several disadvantages that limit its application primarily to DRAM (Dynamic Random Access Memory) products. First, forming deep trench capacitors requires a significant number of complicated and costly processing steps such as etching of deep trenches in a semiconductor substrate, forming buried capacitor plates, filling the deep trenches, etc. Most of these processing steps are unique to deep trench technology, and thus, incompatible with conventional SOI CMOS processing sequence for logic devices such as a processor core. Second, processing steps for manufacturing deep trenches increase total processing time for semiconductor chips, and consequently, increase the time-to-market of products employing deep trench capacitors. Finally, this approach is costly because expensive equipment and heavy investment in research and development are required for the development deep trench related processes.

In view of the above, there exists a need for a high capacitance capacitor compatible with a semiconductor-on-insulator (SOI) complementary metal oxide semiconductor (CMOS) processing sequence, and methods of manufacturing the same without significantly increasing process complexity or cost.

SUMMARY OF THE INVENTION

The present invention addresses the needs described above by providing a multiplanar capacitor employing multiple levels of surfaces of a silicon-on-insulator substrate, and methods of manufacturing the same with minimal number of additional processing steps.

In the present invention, an isolated shallow trench isolation portion is formed in a top semiconductor portion of a semiconductor-on-insulator substrate along with a shallow trench isolation structure surrounding the top semiconductor portion. A trench in the shape of a ring is formed around the doped top semiconductor portion and filled with a conductive material such as doped polysilicon. The top semiconductor portion is doped. The isolated shallow trench isolation portion and the portion of a buried insulator layer bounded by a ring of the conductive material are removed by an etch to form a cavity. A capacitor dielectric is formed on exposed semiconductor surfaces within the cavity and above the doped top semiconductor portion. A conductive material portion formed in the trench and above the doped top semiconductor portion constitutes an inner electrode of a capacitor, while the ring of the conductive material, the doped top semiconductor portion, and a portion of a handle substrate abutting the capacitor dielectric constitutes a second electrode.

According to an aspect of the present invention, a semiconductor structure is provided, which comprises a first electrode, a capacitor dielectric, and a second electrode, wherein the first electrode includes:
a doped top semiconductor portion comprising a doped first semiconductor material, containing a vertical hole therein, and located in a top semiconductor layer of a semiconductor-on-insulator (SOI) substrate;
an enclosing wall having a volume, comprising a first conductive material, encircling the doped top semiconductor portion, and contacting a handle substrate of the SOI substrate; and
a doped handle substrate portion comprising a doped second semiconductor material and located in the handle substrate;
and wherein the capacitor dielectric is located directly on the first electrode;
and wherein the second electrode comprises a second conductive material and located directly on the capacitor dielectric.

In one embodiment, the capacitor dielectric is located on a top surface of the doped handle substrate portion, a bottom surface of the doped top semiconductor portion, an entirety of sidewalls of the hole, and a top surface of the doped top semiconductor portion.

In another embodiment, the capacitor dielectric is located on inner surfaces of the enclosed sidewall, and wherein the capacitor dielectric is of unitary construction.

In even another embodiment, the doped top semiconductor portion and the doped handle substrate portion comprise doped single crystalline silicon, and wherein the enclosing wall comprises a metallic material or another doped semiconductor material.

In yet another embodiment, the enclosing wall comprises the another doped semiconductor material, and wherein doping conductivity types of the doped single crystalline silicon and the another doped semiconductor material are the same.

In still another embodiment, the capacitor dielectric comprises one of a silicon oxide containing dielectric material or a high-k gate dielectric material.

In still yet another embodiment, the doped top semiconductor portion is topologically homeomorphic to a torus, and wherein the enclosing wall is topologically homeomorphic to a torus.

In a further embodiment, the enclosing wall extends from a top surface of the top semiconductor layer through a buried insulator layer to the doped handle substrate portion.

In an even further embodiment, the semiconductor structure further comprises a handle substrate contact plug comprising the first conductive material and extending from a top surface of the top semiconductor layer through a buried insulator layer to the handle substrate.

In a yet further embodiment, the semiconductor structure further comprises a field effect transistor located on the top semiconductor layer and including a gate conductor containing the second conductive material.

In a still further embodiment, the semiconductor structure further comprises a shallow isolation trench structure laterally abutting the enclosing wall and vertically abutting a buried insulator layer.

In a still yet further embodiment, the semiconductor structure further comprises at least one contact via vertically abutting the second electrode and at least another contact via vertically abutting at least one of the doped top semiconductor portion or the enclosing wall.

In another further embodiment, the semiconductor structure further comprises a field effect transistor including a source region, wherein the source region laterally abuts the enclosing wall.

According to another aspect of the present invention, a method of forming a semiconductor structure is provided, which comprises:

forming an isolated shallow trench isolation portion surrounded by a doped top semiconductor portion in a top semiconductor layer of a semiconductor-on-insulator (SOI) substrate;

forming a trench encircling the doped top semiconductor portion and extending through a buried insulator layer to a handle substrate;

filling the trench with a conductive material;

removing the isolated shallow trench isolation portion to form a hole in the doped top semiconductor portion;

removing a portion of the buried insulator layer bounded by the conductive material to from a cavity in the buried insulator layer; and forming a capacitor dielectric on a portion of the handle substrate directly beneath the cavity, a bottom surface of the doped top semiconductor portion, sidewall surfaces of the hole, and a top surface of the doped top semiconductor portion.

In one embodiment, the method further comprises depositing another conductive material in the cavity and the hole.

In another embodiment, the method further comprises forming a doped handle substrate portion vertically abutting the buried insulator layer by implanting dopants into the handle substrate.

In even another embodiment, the conductive material directly contacts the doped top semiconductor portion and the doped handle substrate portion.

In yet another embodiment, the method further comprises forming a gate conductor of a field effect transistor comprising the another conductive material at the same step as the depositing of the another conductive material.

In still another embodiment, the method further comprises forming at least one handle substrate contact plug comprising the conductive material at the same step as the filling of the trench.

In still yet another embodiment, the method further comprises:

forming a shallow trench isolation structure at the same step as the forming of the isolated shallow trench isolation, and forming at least one semiconductor device on the SOI substrate, wherein the shallow trench isolation structure provides electrical isolation between the conductive material filled within the trench and the at least one semiconductor device.

BRIEF DESCRIPTION OF THE DRAWINGS

FIGS. 1, 2, 4, 6, 8-13, 15 are sequential vertical cross-sectional views of the exemplary semiconductor structure.

FIGS. 3, 5, 7, and 14 are top-down views of the exemplary semiconductor structure at processing steps corresponding to FIGS. 2, 4, 6, and 13, respectively.

DETAILED DESCRIPTION OF THE INVENTION

Figure 1:
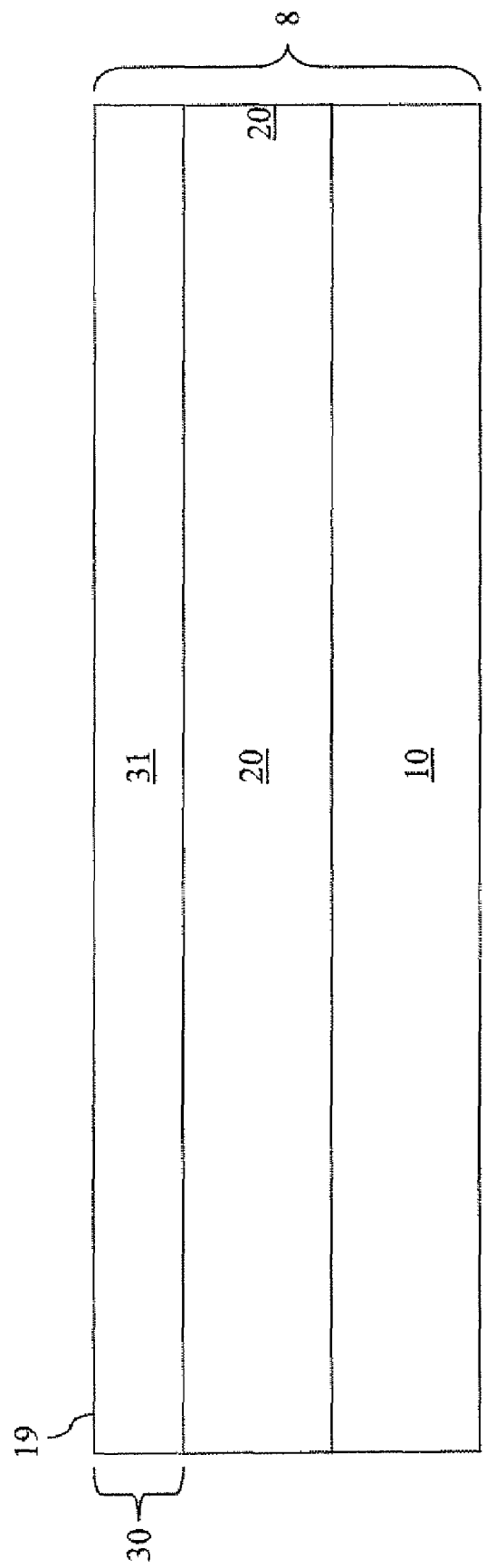
FIGS. 1-15 are views of an exemplary semiconductor structure according to the present invention.

As stated above, the present invention relates to an SOI CMOS process compatible capacitor having multiplanar capacitor surfaces and methods of manufacturing the same, which are now described in detail with accompanying figures. It is noted that like and corresponding elements are referred to by like reference numerals.

Referring to FIG. 1, an exemplary semiconductor structure according to the present invention comprises a semiconductor-on-insulator (SOI) substrate 8 containing a handle substrate 10, a buried insulator layer 20, and a top semiconductor layer 30. The handle substrate 10 comprises a semiconductor material such as silicon. Preferably, the handle substrate 10 comprises a single crystalline semiconductor material. The handle substrate 10 may be undoped or have a p-type doping or an n-type doping. The conductivity of the doping of the handle substrate is herein referred to as a first conductivity type. The dopant concentration of the handle substrate 10 is from about $1.0\times10^{13}/cm^3$ to about $5.0\times10^{18}/cm^3$, and typically at a dopant concentration from about $1.0\times10^{15}/cm^3$ to about $3.0\times10^{16}/cm^3$. The buried insulator layer 20 comprises a dielectric material such as silicon oxide or silicon nitride. The thickness of the buried insulator layer 20 may be from about 20 nm to about 500 nm, and typically from about 100 nm to about 200 nm. Implementation of the present invention on a hybrid substrate containing a bulk portion and an SOI portion is explicitly contemplated herein.

The top semiconductor layer 30 comprises a contiguous top semiconductor portion 31, which, at this point, is not patterned. The thickness of the top semiconductor layer 30 may be from about 5 nm to about 300 nm, and preferably from about 20 nm to about 100 nm. Preferably, the contiguous top semiconductor portion 31 comprises a single crystalline semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The contiguous top semiconductor portion 31 may have a built-in biaxial stress in the plane of the top semiconductor layer 30, i.e., in the plane perpendicular to the direction of the surface normal of a top surface 19 of the SOI substrate 8. The contiguous top semiconductor portion 31 may be substantially undoped of may have a doping of the first conductivity type or a doping of the opposite type of the first conductivity type, which is herein referred to as a second conductivity type. The dopant concentration of the contiguous top semiconductor portion 31 may be from about $1.0\times10^{13}/cm^3$ to about $5.0\times10^{18}/cm^3$, and typically from about $1.0\times10^{15}/cm^3$ to about $3.0\times10^{17}/cm^3$.

Figure 2:
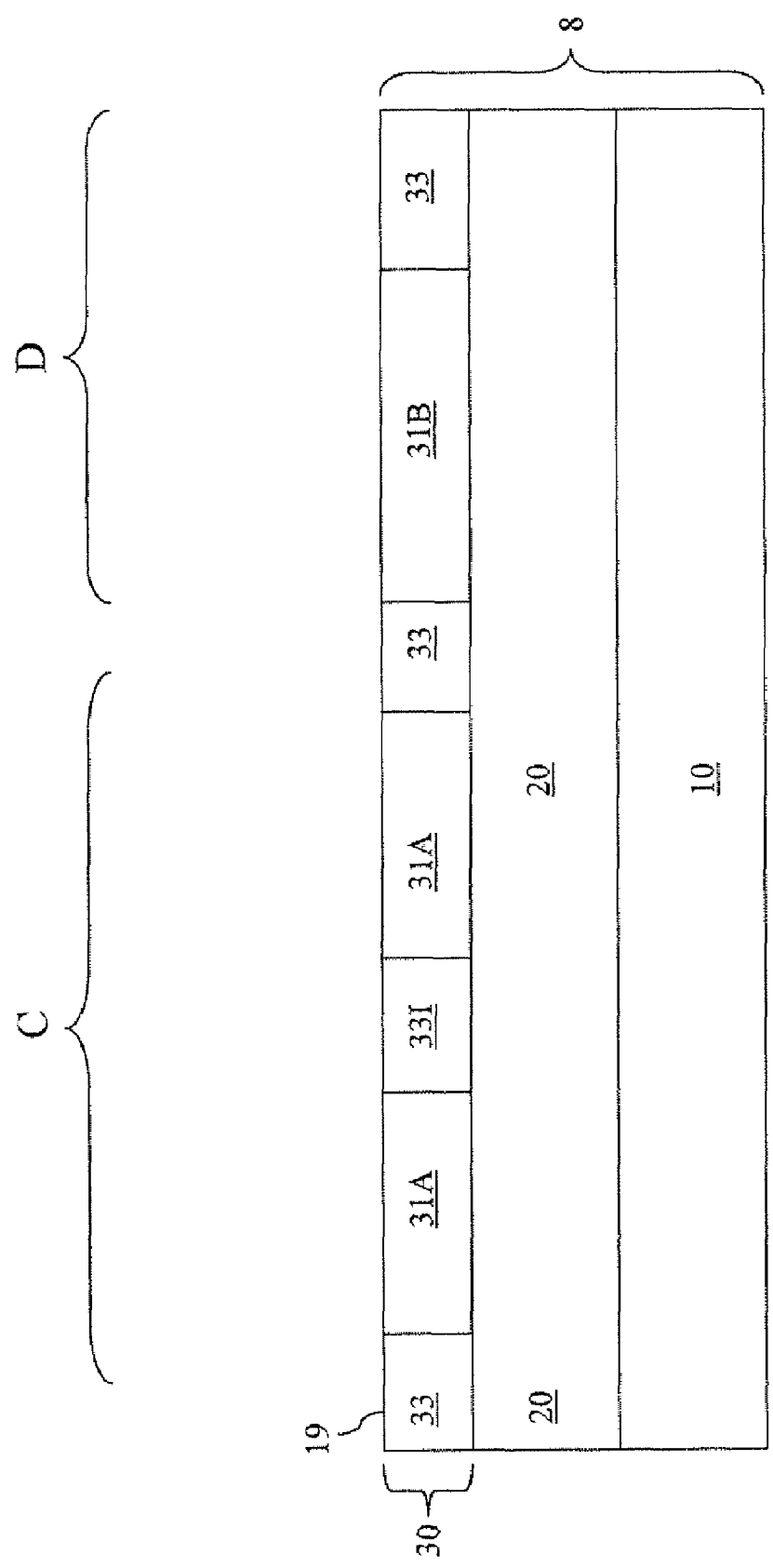
Figure 3:
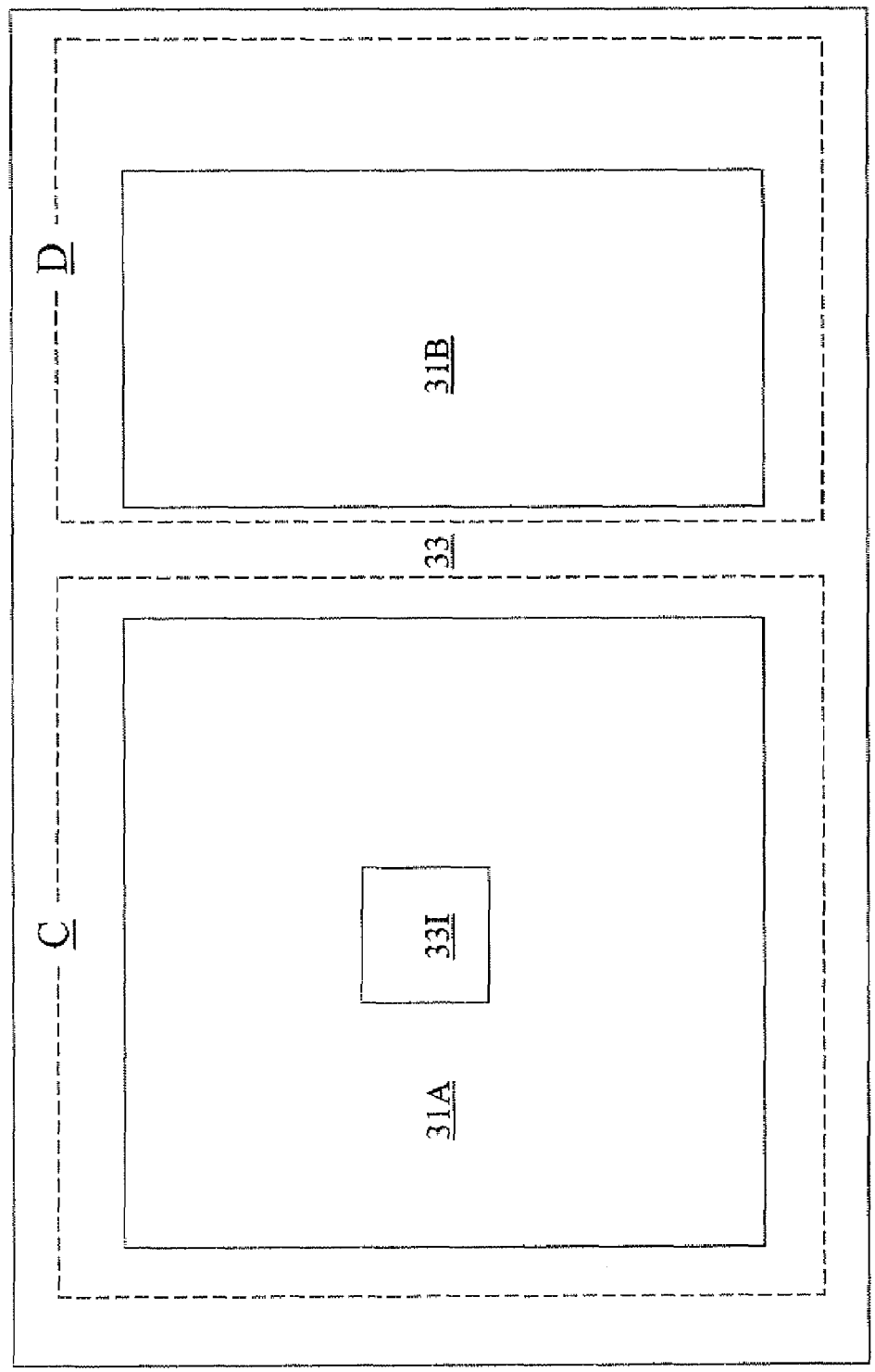

Referring to FIGS. 2 and 3, a shallow trench isolation structure 33 laterally enclosing a first top semiconductor portion 31A, which is a portion of the contiguous top semiconductor portion 31, is formed. The first top semiconductor portion 31A is formed within a capacitor region C, which is an area of the SOI substrate 8 in a top-down view. The shallow trench isolation structure, which extends from the top surface 19 of the SOI substrate 8 to the buried insulator layer 20, is formed in the top semiconductor layer 30. An isolated shallow trench isolation portion 33I is formed concurrently with formation of the shallow trench isolation structure 33 in a middle of the first top semiconductor portion 31A such that the isolated shallow trench isolation portion 33I is completely surrounded by the first top semiconductor portion 31A. In addition, the shallow trench isolation structure 33 laterally encloses a second top semiconductor portion 31B, which is disjoined from the first top semiconductor portion 31A. The second top semiconductor portion 31B is formed within a device region D, which is another area of the SOI substrate 8 in the top-down view. The capacitor region C and the device region D are disjoined from each other.

The first top semiconductor portion 31A has a hole in the middle which is occupied by the isolated shallow trench isolation portion 33I. Thus, the first top semiconductor portion 31A is topologically homeomorphic to a torus, i.e., the shape of the first top semiconductor portion 31A may be continually stretched and bent to a torus without forming or destroying a hole. A torus is a three dimensional topological object of genus 1 having one topological handle. While the present invention is described with one hole in the first top semiconductor portion 31A, embodiments in which multiple holes are formed in the first top semiconductor portion 31A are explicitly contemplated herein.

The isolated shallow trench isolation portion 33I and the shallow trench isolation structure 33 comprise a dielectric material such as a dielectric oxide or a dielectric nitride. For example, the isolated shallow trench isolation portion 33I and the shallow trench isolation structure 33 may comprise a silicon oxide such as tetra-ethyl-ortho-silicate (TEOS) oxide, undoped silicate glass (USG), and/or other silicon oxide formed by chemical vapor deposition (CVD).

Figure 4:
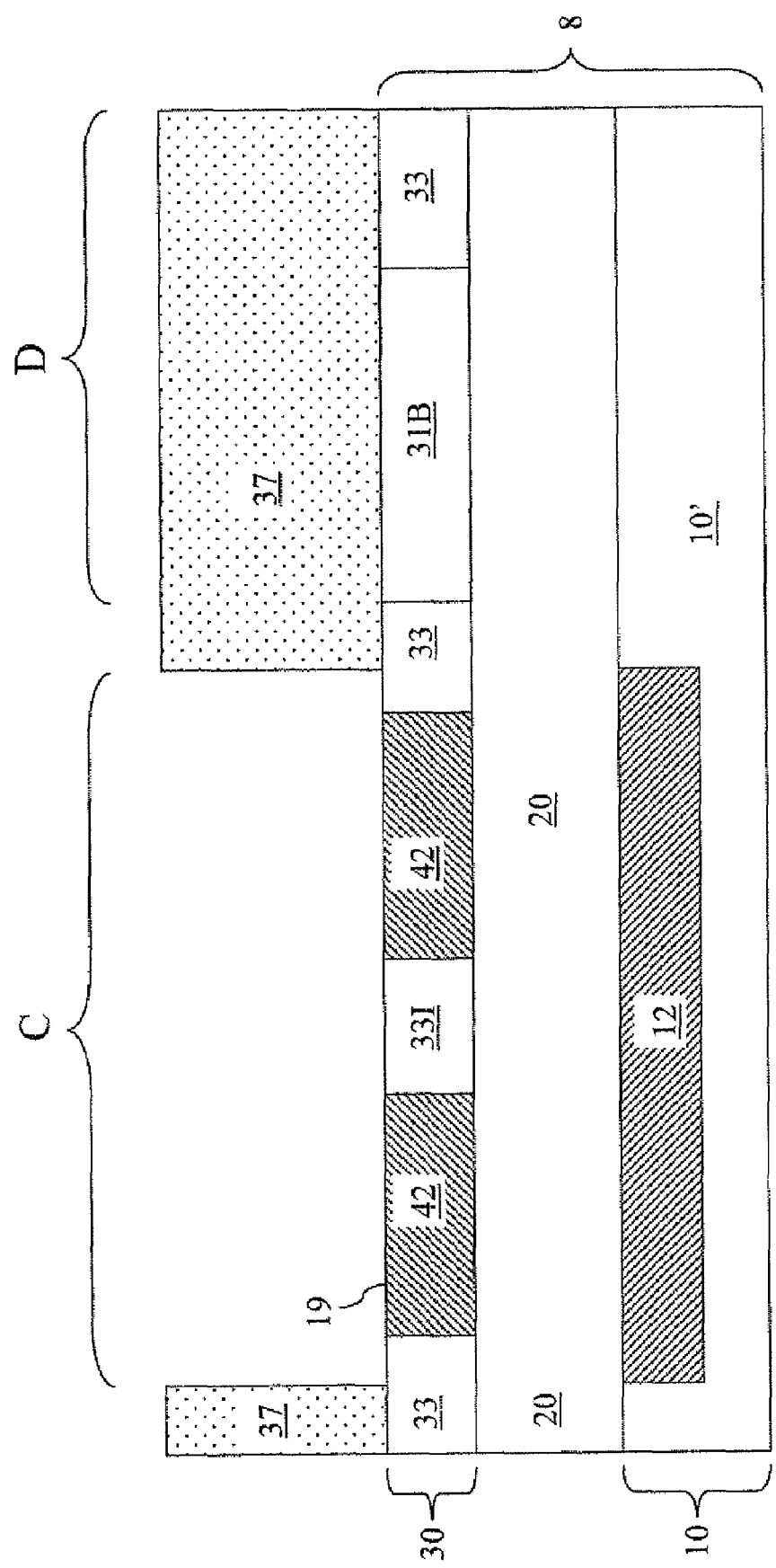
Figure 5:
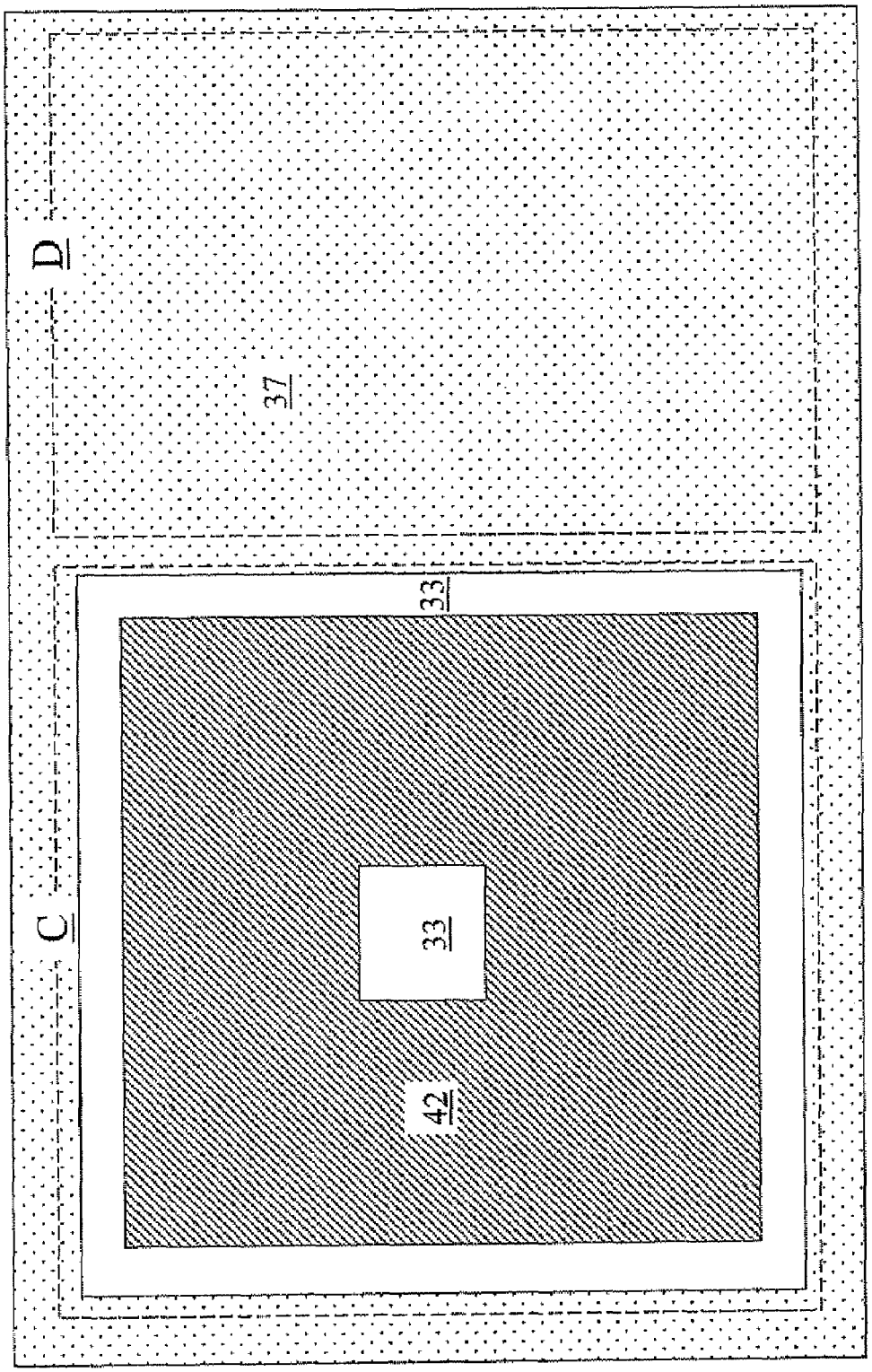

Referring to FIGS. 4 and 5, a first block mask 37 is applied to the top surface 19 of the SOI substrate 8 and lithographically patterned to expose the capacitor region C, while covering the device region D. Preferably, all of the surface area of the first top semiconductor portion 31A is exposed. Typically, a portion of the shallow trench isolation structure 33 adjacent to and surrounding the first top semiconductor portion 31A is also exposed. The first block mask 37 may be a soft mask comprising a first photoresist.

Additional dopants are implanted into the handle substrate 10 in the capacitor region C to convert a portion of the handle substrate 10 into a doped semiconductor region 12. The remaining portion of the handle substrate constitutes a handle semiconductor portion 10' having the same dopant concentration as the handle substrate 10 prior to formation of the doped semiconductor region 12.

After the implantation of the additional dopants, the doped semiconductor region 12 has a dopant concentration from about $1.0\times10^{14}/cm^3$ to about $3.0\times10^{21}/cm^3$, and typically at a dopant concentration from about $1.0\times10^{18}/cm^3$ to about $5.0\times10^{20}/cm^3$, although lesser and greater dopant concentrations are also explicitly contemplated herein. The doped handle substrate portion 12 vertically abuts the buried insulator layer 20. The lateral extent of the doped handle substrate portion 12 substantially coincides with the edges of the first block mask 37 that defines the opening for ion implantation into the SOI substrate 8. The thickness of the doped semiconductor layer portion 12 may be from about 30 nm to about 1,000 nm, and typically from about 100 nm to about 300 nm, although lesser and greater thicknesses are also explicitly contemplated herein. While the present invention is described with the handle semiconductor portion 10' having the first conductivity type doping, methods of forming a well in a semiconductor substrate, in which the well has the opposite type of doping than the substrate is known in the art. Embodiments in which a well of a first conductivity type doping is formed within a substrate having a doping of the first conductivity type, in which the well underlies the doped handle substrate portion 12 having the doping of the second conductivity type is explicitly contemplated herein.

Dopants are also implanted into the first top semiconductor portion 31A to form a doped top semiconductor portion 42. Preferably, all of the first top semiconductor portion 31A is converted into the doped top semiconductor portion 42, although embodiments in which only a portion of the first top semiconductor portion 31A is converted into the doped top semiconductor portion 42 are explicitly contemplated herein. The dopant concentration of the doped top semiconductor portion 42 is from about $1.0\times10^{18}/cm^3$ to about $3.0\times10^{21}/cm^3$, and typically from about $1.0\times10^{14}/cm^3$ to about $5.0\times10^{20}/cm^3$, although lesser and greater dopant concentrations are also explicitly contemplated herein. The conductivity type of the additional dopants may be the same or different from the conductivity of the dopants in the handle semiconductor portion 10'. The first block mask 37 is then removed, for example, by ashing.

Alternatively, the steps of the application and patterning of the first block mask 37 and the additional dopant implantation are omitted. Thus, the top semiconductor portion 42 may have the same dopant concentration as the top semiconductor portion 31B and the handle substrate portion 12 may have the same dopant concentration as the handle semiconductor portion 10'.

Figure 6:
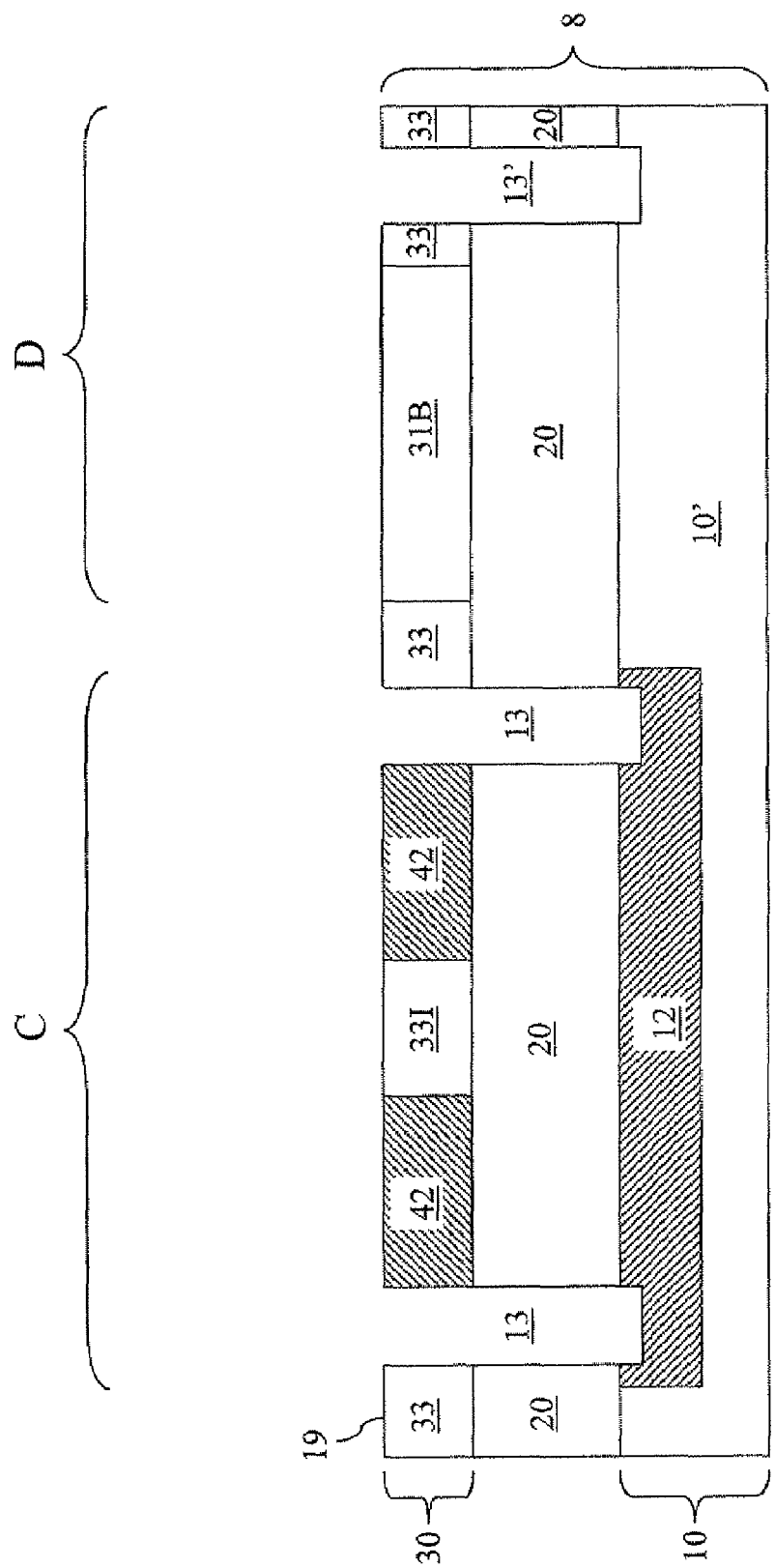
Figure 7:
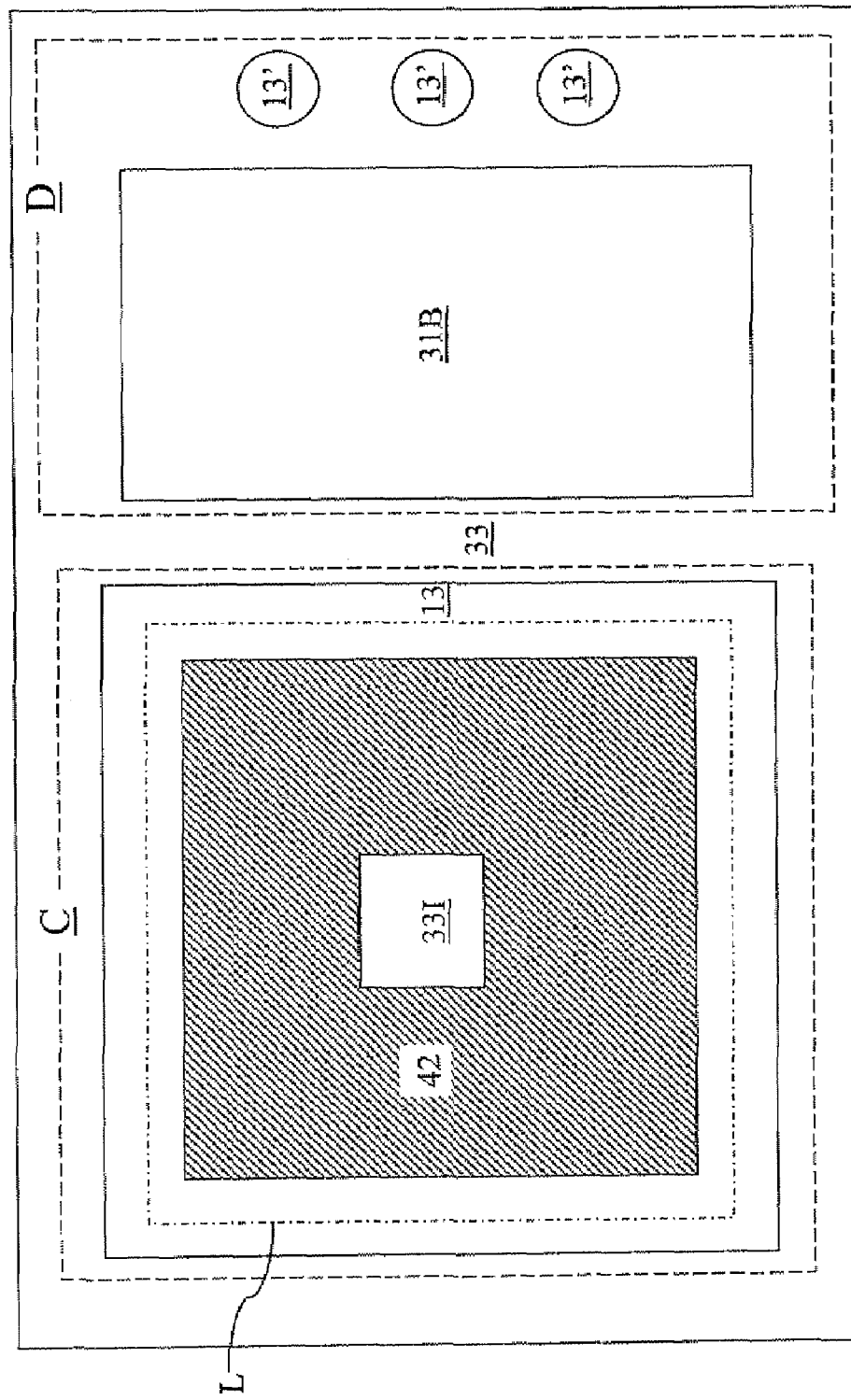

Referring to FIGS. 6 and 7, a second block mask (not shown) is applied to the top semiconductor layer 30 and patterned. The pattern in the second block mask is transferred into the top semiconductor layer 30, the buried insulator layer 20, and a top portion of the doped handle substrate portion 12 by an anisotropic reactive ion etch. The second block mask may be a soft mask comprising a second photoresist, or may be a hard mask comprising a dielectric material such as silicon nitride. Methods of patterning a soft mask or a hard mask are well known in the art. The second block mask is subsequently removed, for example, by ashing and/or etching.

The pattern in the top semiconductor layer 30, the buried insulator layer 20, and the top portion of the handle substrate 10 comprises a closed line trench 13 encircling the doped top semiconductor portion 42 and a portion of the buried insulator layer directly beneath the doped top semiconductor portion 42. The closed line trench 13 is formed in the capacitor region C. The closed line trench 13 is a line trench having a segment having two substantially parallel sidewalls extending horizontally. The two substantially parallel sidewalls may be planar or may have a curvature. A hypothetical line L running through the middle of the closed line trench is a closed line, hence the name "closed line trench". Inner sidewalls of the closed line trench 13 contain outer sidewall surfaces of the doped top semiconductor portion 42. Outer sidewalls of the close line trench 13 contain sidewall surfaces of the shallow trench isolation structure 33.

Concurrently with formation of the closed line trench 13, at least one handle substrate contact hole 13' may be formed by etching at least one discrete hole through the shallow trench isolation structure 33, the buried insulator layer 20, and a top portion of the handle semiconductor portion 10' in the device region D.

Figure 8:
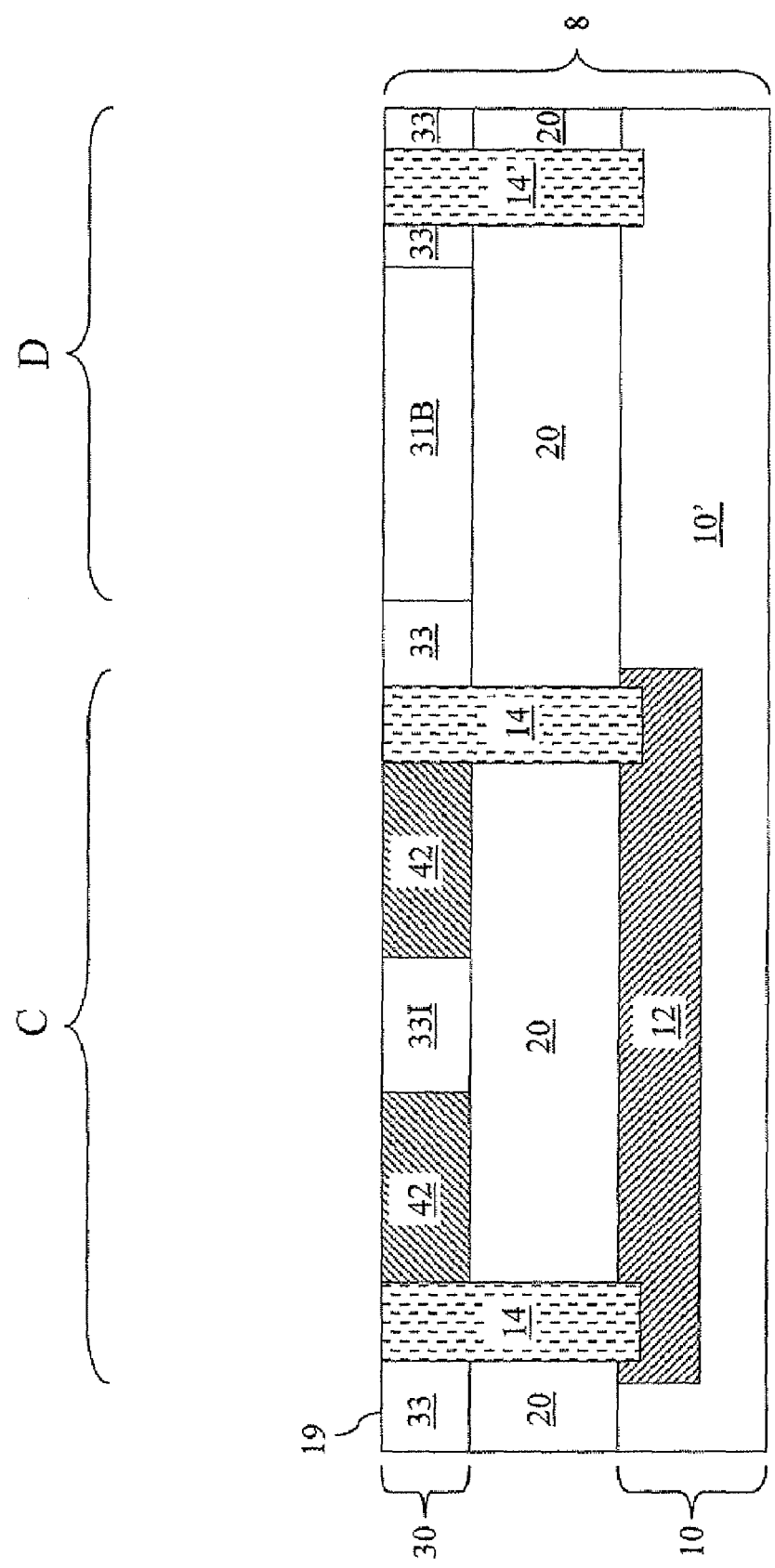

Referring to FIG. 8, the closed line trench 13 and the at least one handle substrate contact hole 13' are filled with a first conductive material to form an enclosing wall 14 comprising a first conductive material within the closed line trench 13 and at least one handle substrate contact plug 14' in the at least one handle substrate contact hole 13'. Since the closed line trench 13 has a finite width all around, the enclosing wall 14 has a volume. Specifically, the inner sidewall surfaces of the enclosing wall 14 and the outer sidewall surfaces of the enclosing wall 14 are disjoined from each other with a separation that may, or may not, be constant around the enclosing wall 14. The enclosing wall 14 encases the doped top semiconductor portion 42 and separates the doped top semiconductor portion 42 and a portion of the buried insulator layer directly beneath the doped top semiconductor portion from the shallow trench isolation structure 33 and the portion of the buried insulator layer outside the closed line trench 13, hence the name "enclosing wall." The enclosing wall 14 is topologically homeomorphic to a torus.

The first conductive material may comprise any suitable conductive material, including but not limited to, a doped semiconductor material (e.g., polycrystalline or amorphous silicon, germanium, and a silicon germanium alloy), a metal (e.g., tungsten, titanium, tantalum, ruthenium, cobalt, copper, aluminum, lead, platinum, tin, silver, and gold), a conducting metallic compound material (e.g., tantalum nitride, titanium nitride, tungsten silicide, tungsten nitride, titanium nitride, tantalum nitride, ruthenium oxide, cobalt silicide, and nickel silicide), or any suitable combination of these materials. Thus, the doped top semiconductor portion 42, the enclosing wall 14, and the doped handle substrate portion 12 are electrically connected. Similarly, the at least one handle substrate contact plug 14' may provide an electrical contact to the handle semiconductor portion 10'.

Figure 9:
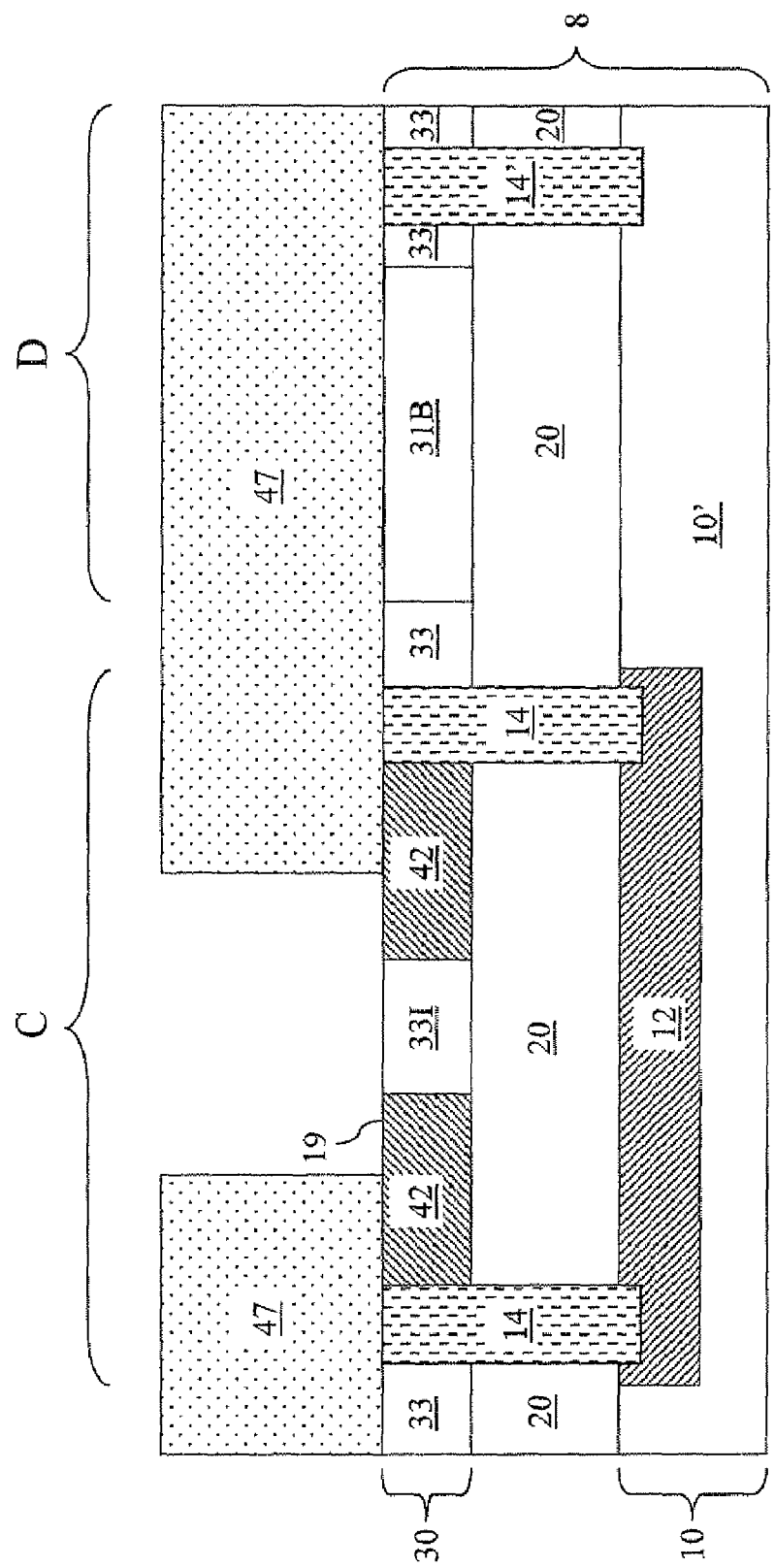

Referring to FIG. 9, a third block mask 47 is formed on the SOI substrate 8 and lithographically patterned to expose the isolated shallow trench isolation portion 33I, while protecting the shallow trench isolation structure 33 surrounding the enclosing wall 14. The third block mask 47 may be a soft mask comprising a third photoresist, or may be a hard mask comprising a dielectric material such as silicon nitride. Methods of patterning a soft mask or a hard mask are well known in the art. The edges of the third block mask 47 are located on the doped top semiconductor portion 42 or the enclosing wall 14.

Figure 10:
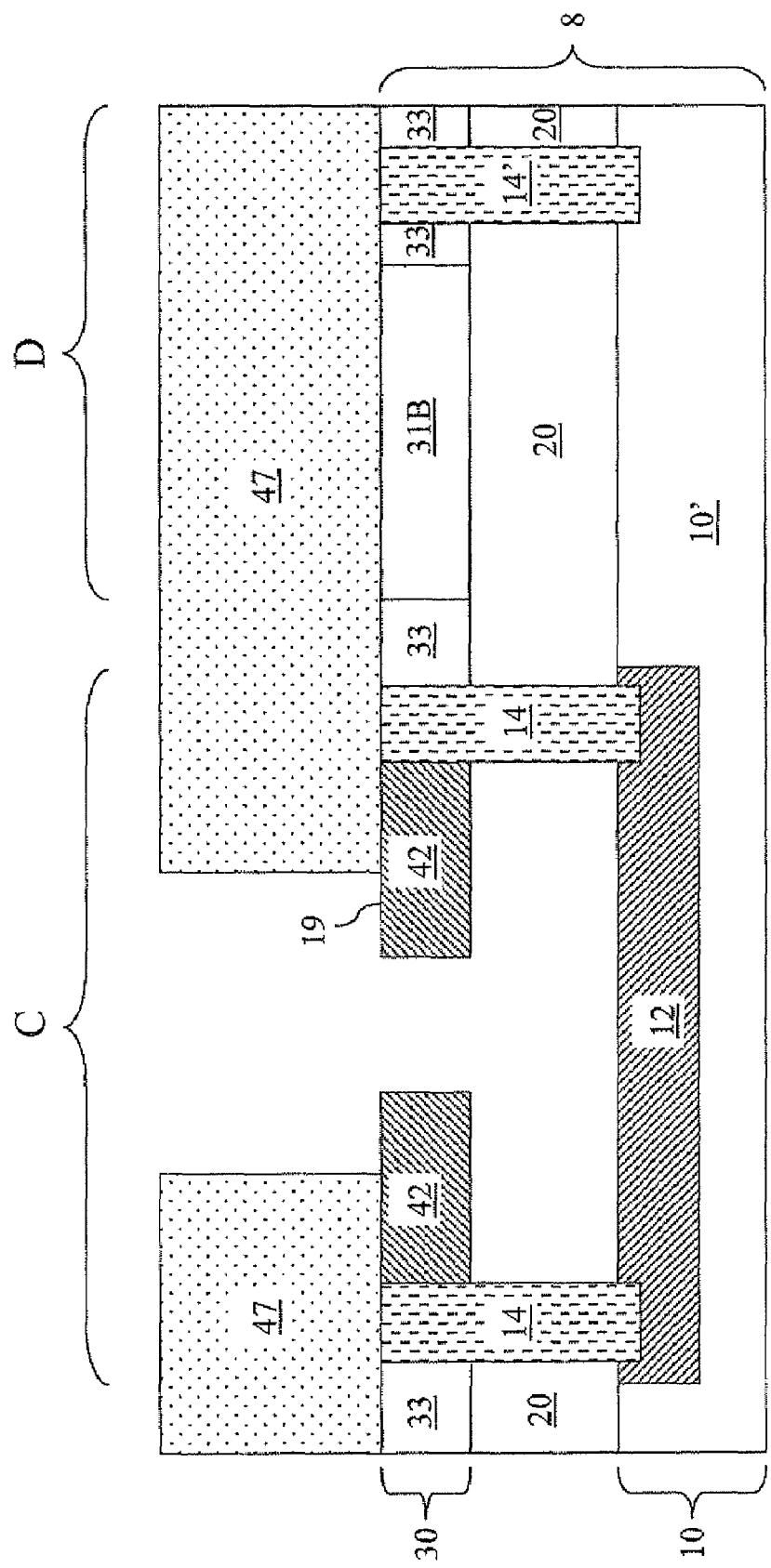

Referring to FIG. 10, the isolated shallow trench isolation portion 33I and the portion of the buried insulator layer surrounded by the enclosing wall 14 are removed by an etch. The etch may be a wet etch or a substantially isotropic chemical downstream etch (CDE) that etches the material of the isolated shallow trench isolation portion 33I and the material of the buried insulator layer 20 selective to the doped top semiconductor portion 42 and the enclosing wall 14. Preferably, the etch is also selective to the doped handle substrate portion 12. For example, the isolated shallow trench isolation portion 33I and the buried insulator layer 20 may comprise silicon oxide, the doped top semiconductor portion 42 and the doped handle substrate portion 12 may comprise silicon, the enclosing wall 14 may comprise doped polysilicon, and the etch may be a hydrofluoric acid (HF) based wet etch that etches silicon oxide selective to silicon. A cavity is formed beneath the doped top semiconductor layer 42 and above the doped handle substrate portion 12. The cavity is connected to an outside space through a hole within the doped top semiconductor layer 42. The block mask 47 is subsequently removed.

Figure 11:
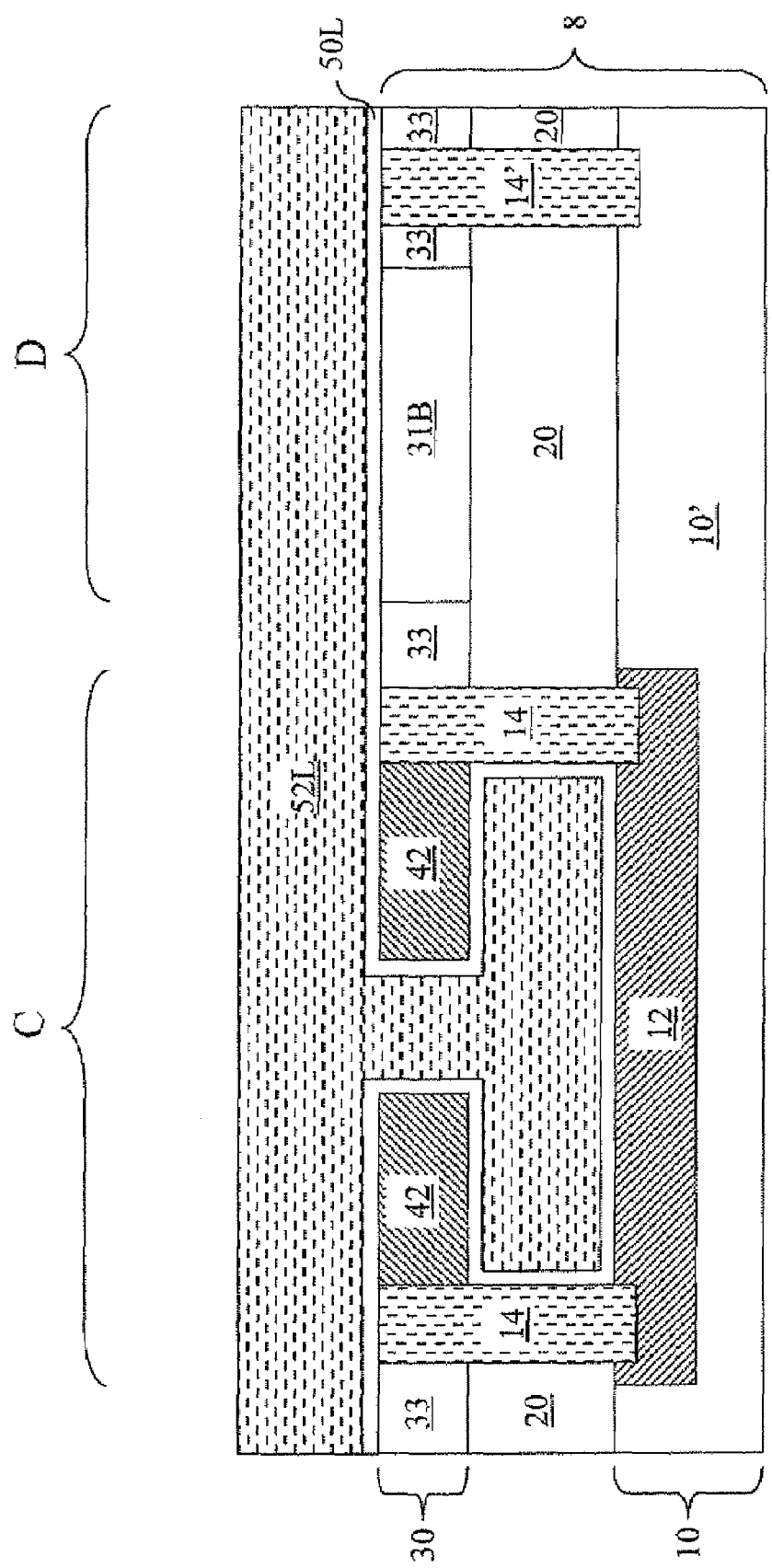

Referring to FIG. 11, a capacitor dielectric layer 50L and a second electrode layer 52L are formed on exposed semiconductor surfaces. In one embodiment, the capacitor dielectric layer 50L may comprise a silicon containing dielectric material such as silicon oxide, silicon nitride, and/or silicon oxynitride. The silicon containing dielectric material may be formed by thermal oxidation of silicon containing semiconductor materials. For example, the doped top semiconductor portion 42 and the doped handle substrate portion 12 may comprise silicon, the enclosing wall 14 may comprise doped polysilicon, and the capacitor dielectric layer 50L comprises silicon oxide formed by conversion of crystalline silicon or polysilicon in the doped top semiconductor portion 42, the doped handle substrate portion 12, and the enclosing wall 14. Alternatively, the silicon containing material may be formed by deposition of a silicon nitride by chemical vapor deposition and optionally followed by an oxidation process.

In another embodiment, the capacitor dielectric layer 50L comprises a high-k (high dielectric constant) dielectric material known in the art. Non-limiting exemplary high-k gate dielectric materials include $HfO_2$, $ZrO_2$, $Al_2O_3$, $TiO_2$, $La_2O_3$, $SrTiO_3$, $LaAlO_3$, $Y_2O_3$, mixtures thereof, and silicates thereof. Methods of forming a high-k dielectric material layer are well known in the art. For example, atomic layer deposition (ALD) can be used to deposit high-k dielectric.

Preferably, the capacitor dielectric layer 50L comprises the same material as a gate dielectric layer. More preferably, the capacitor dielectric layer 50L and the gate dielectric layer are one and the same, i.e., a portion of the capacitor dielectric layer 50L located outside the capacitor region C of the SOI substrate 8 such as the device region D is employed as a gate dielectric layer to form a gate dielectric of a field effect transistor.

The second electrode layer 52L comprises a second conductive material, which may comprise any suitable conductive material, including but not limited to, a doped semiconductor material (e.g., polycrystalline or amorphous silicon, germanium, and a silicon germanium alloy), a metal (e.g., tungsten, titanium, tantalum, ruthenium, cobalt, copper, aluminum, lead, platinum, tin, silver, and gold), a conducting metallic compound material (e.g., tantalum nitride, titanium nitride, tungsten silicide, tungsten nitride, titanium nitride, tantalum nitride, ruthenium oxide, cobalt silicide, and nickel silicide), or any suitable combination of these materials. For example, the second conductive material may comprise doped polysilicon having a dopant concentration from about $1.0 \times 10^{19}/cm^3$ to about $3.0 \times 10^{21}/cm^3$, and typically from about $1.0 \times 10^{20}/cm^3$ to about $5.0 \times 10^{20}/cm^3$, although lesser and greater dopant concentrations are also explicitly contemplated herein. Alternately, the second electrode layer 52L may comprise a metal gate layer such as TaN, TiN, WN, etc. Preferably, deposition of the second electrode layer 52L is conformal. Also preferably, the thickness of the second electrode layer 52L is greater than half the thickness of the buried insulator layer 20 and half a width of the hole within the doped top semiconductor portion 42 to facilitate a void-free fill of the cavity. The height of the second electrode layer 52L as measured above the doped top semiconductor portion 42 may be from about 50 nm to about 300 nm, and typically from about 100 nm to about 150 nm.

Preferably, the second electrode layer 52L comprises the same material as a gate conductor layer. More preferably, the second electrode layer 52L and the gate conductor layer are one and the same, i.e., a portion of the second electrode layer 52L located outside the capacitor region C of the SOI substrate 8 such as the device region D is employed as a gate conductor layer to form a gate conductor of a field effect transistor.

Figure 12:
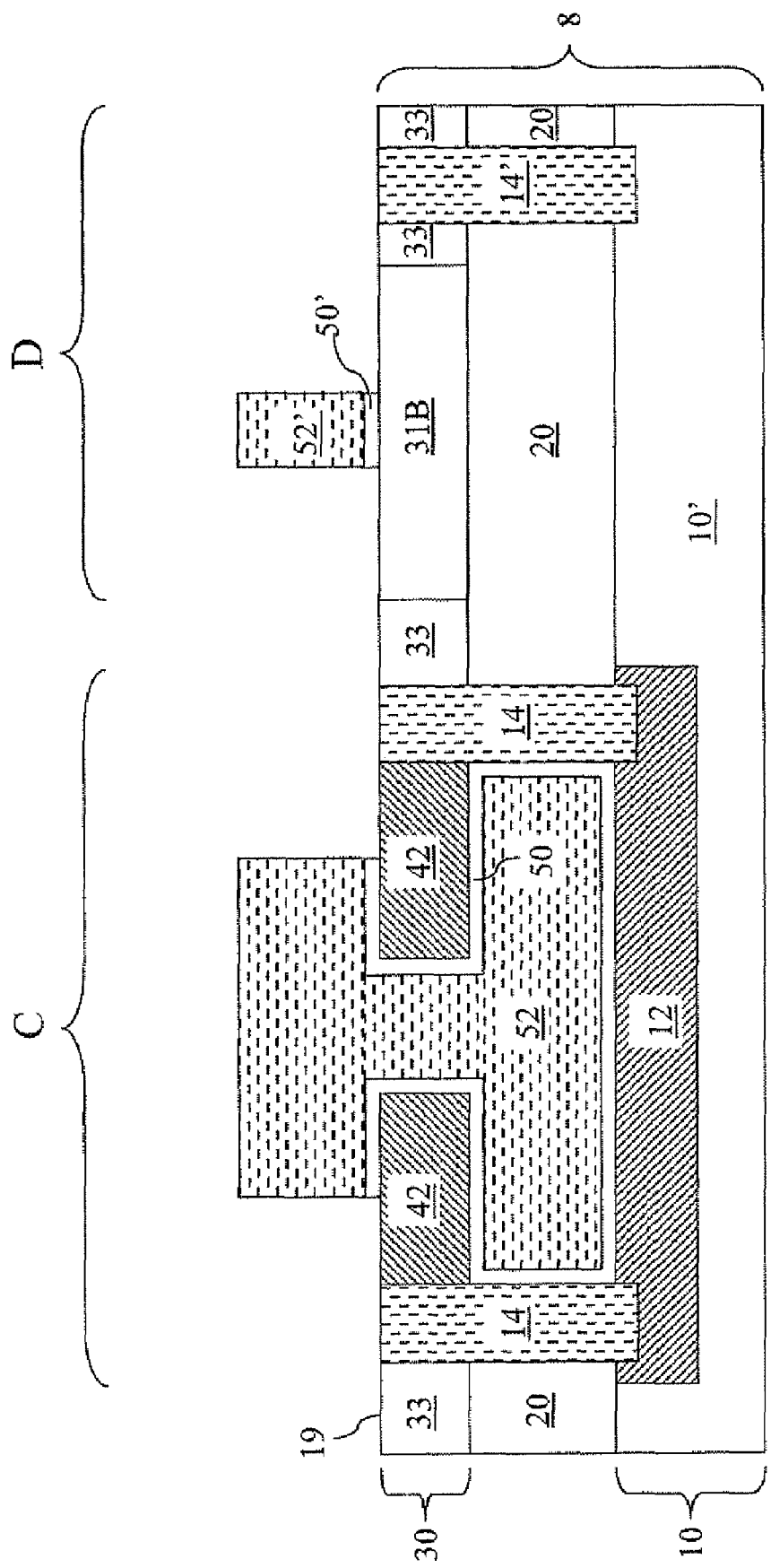

Referring to FIG. 12, the second electrode layer 52L and the capacitor dielectric layer 50L are patterned by lithographic methods and a reactive ion etch to form a second electrode 52 and a capacitor dielectric 50 in the capacitor region C, while forming a gate conductor 52' and a gate dielectric 50' in the device region D.

The sidewalls of the second electrode 52 are formed above the doped top semiconductor layer 42 or above the enclosing wall 42. In other words, the second electrode 52 may, or may not extend over the enclosing wall 14. In the case that the enclosing wall 14 is subsequently contacted by a contact via, the second electrode 52 typically does not extend over the enclosing wall 14. In the case the enclosing wall 14 is not subsequently contacted by a contact via, the second electrode 52 may extend over the enclosing wall 14 to increase area of a capacitor comprising the capacitor dielectric 50. The gate conductor 52' is patterned in a shape of a gate electrode as is well known in the art.

Figure 13:
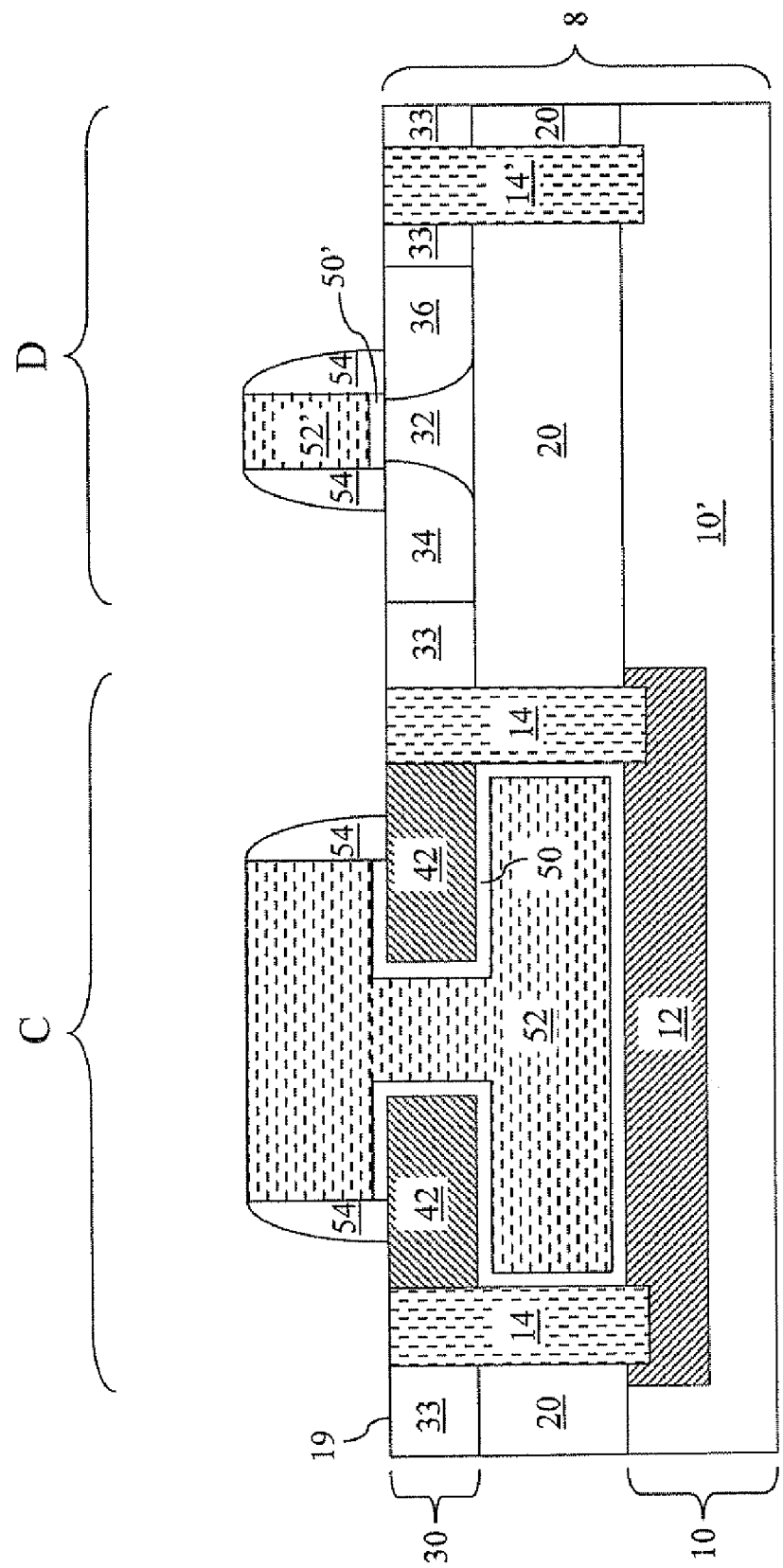
Figure 14:
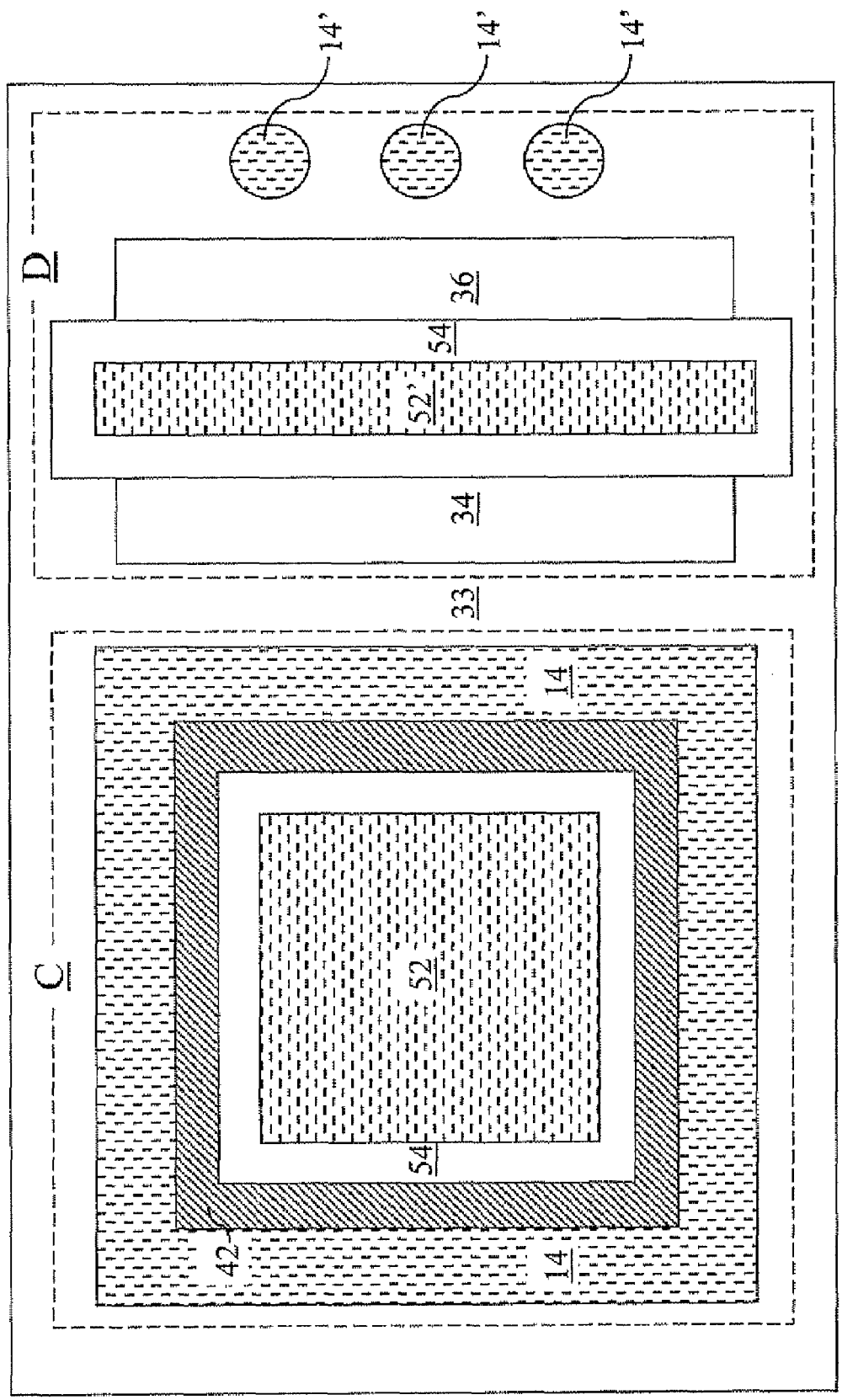

Referring to FIGS. 13 and 14, a source region 34 and a drain region 36 are formed in the second top semiconductor portion 31B, for example, by incorporating dopants in the source region 34 and the drain region 36. Methods for incorporating dopants include but are not limited to ion implantation, gas phase doping, plasma doping, plasma immersion ion implantation, infusion doping, liquid phase doping, and solid phase doping. Masks may be employed as needed. An intact portion of the second top semiconductor layer 31B, i.e., a portion of the second top semiconductor portion 31B without incorporating dopants during the formation of the source and drain regions (34,36), constitutes a body 32 of a field effect transistor. The field effect transistor may be of the first conductivity type or the second conductivity type, i.e., may be a p-type channel transistor or an n-type channel transistor.

Gate spacers 54 are formed around the second electrode 52 in the capacitor region C and the gate conductor 52' in the device region D. One of the gate spacers 54 around the second electrode 52 provides electrical insulation between the second electrode 52 and the doped top semiconductor layer 42. The gate spacer 54 around the second electrode 54 may be formed on the doped top semiconductor layer 42 and/or the enclosing wall 14. Multiple gate spacers 54 may be formed to provide improved source and drain dopant profile in the field effect transistor in the device region as well known in the art.

The exemplary semiconductor structure contains a capacitor in the capacitor region C and a field effect transistor in the device region D. The capacitor comprises a first electrode, the capacitor dielectric 50, and the second electrode 52. The first electrode includes:

the doped top semiconductor portion 42 comprising a doped first semiconductor material, containing a vertical hole therein, and located in the top semiconductor layer 30 of the semiconductor-on-insulator (SOI) substrate 8;

the enclosing wall 14 having a volume, comprising the first conductive material, encircling the doped top semiconductor portion 42, and contacting the handle substrate 10 of the SOI substrate 8; and the doped handle substrate portion 12 comprising the doped second semiconductor material and located in the handle substrate 10.

Metal semiconductor alloys such as a metal silicide may be formed as needed on exposed semiconductor surfaces employing methods well known in the art.

Figure 15:
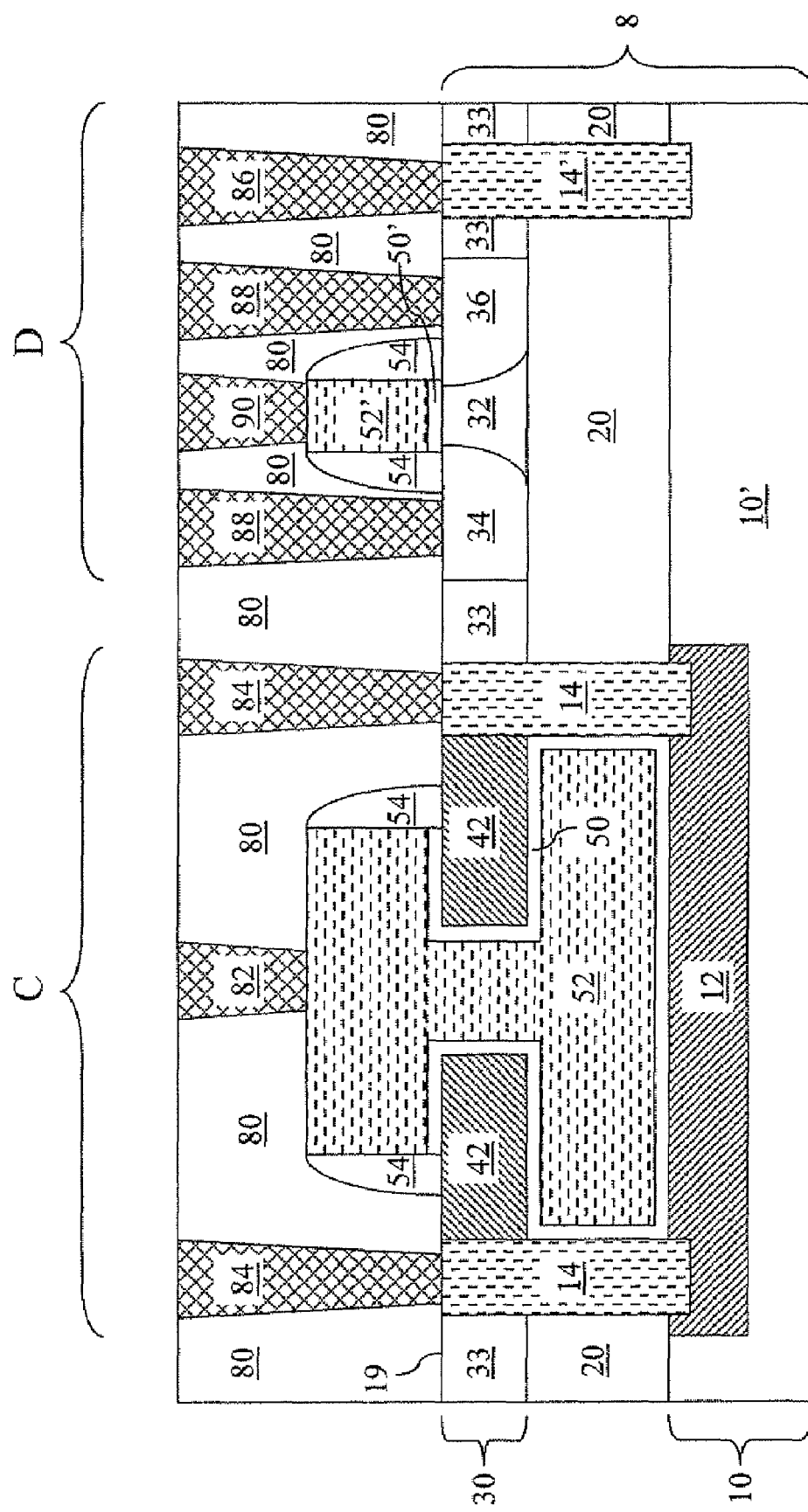

Referring to FIG. 15, a middle-of-line dielectric layer 80 is formed on the SOI substrate 8. The MOL dielectric layer 80 may include a mobile ion diffusion barrier layer (not shown) that prevents diffusion of mobile ions such as $Na^+$ and $K^+$ from back-end-of-line (BEOL) dielectric layers into the top semiconductor layer 30. The MOL dielectric layer 80 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 80 may be from about 200 nm to about 500 nm. The MOL dielectric layer 80 is preferably planarized, for example, by chemical mechanical polishing (CMP).

Various contact via holes are formed in the MOL dielectric layer 80 and filled with metal to from various contact vias. Specifically, at least one first electrode contact via 84 may be formed on the enclosing wall 14 or on the doped top semiconductor layer 42. Preferably, the at least one first electrode contact via 84 is formed on the enclosing wall 14 to utilize as much surface area of the doped top semiconductor portion 42 for a first electrode of the capacitor. At least on second electrode contact via 82 is formed on the second electrode 82. Source and drain contact vias 88 and a gate contact via 90 may be formed on the transistor in the device region D. At least one handle substrate contact via 86 may be formed on the at least one handle substrate contact plug 14'.

Figure 16:
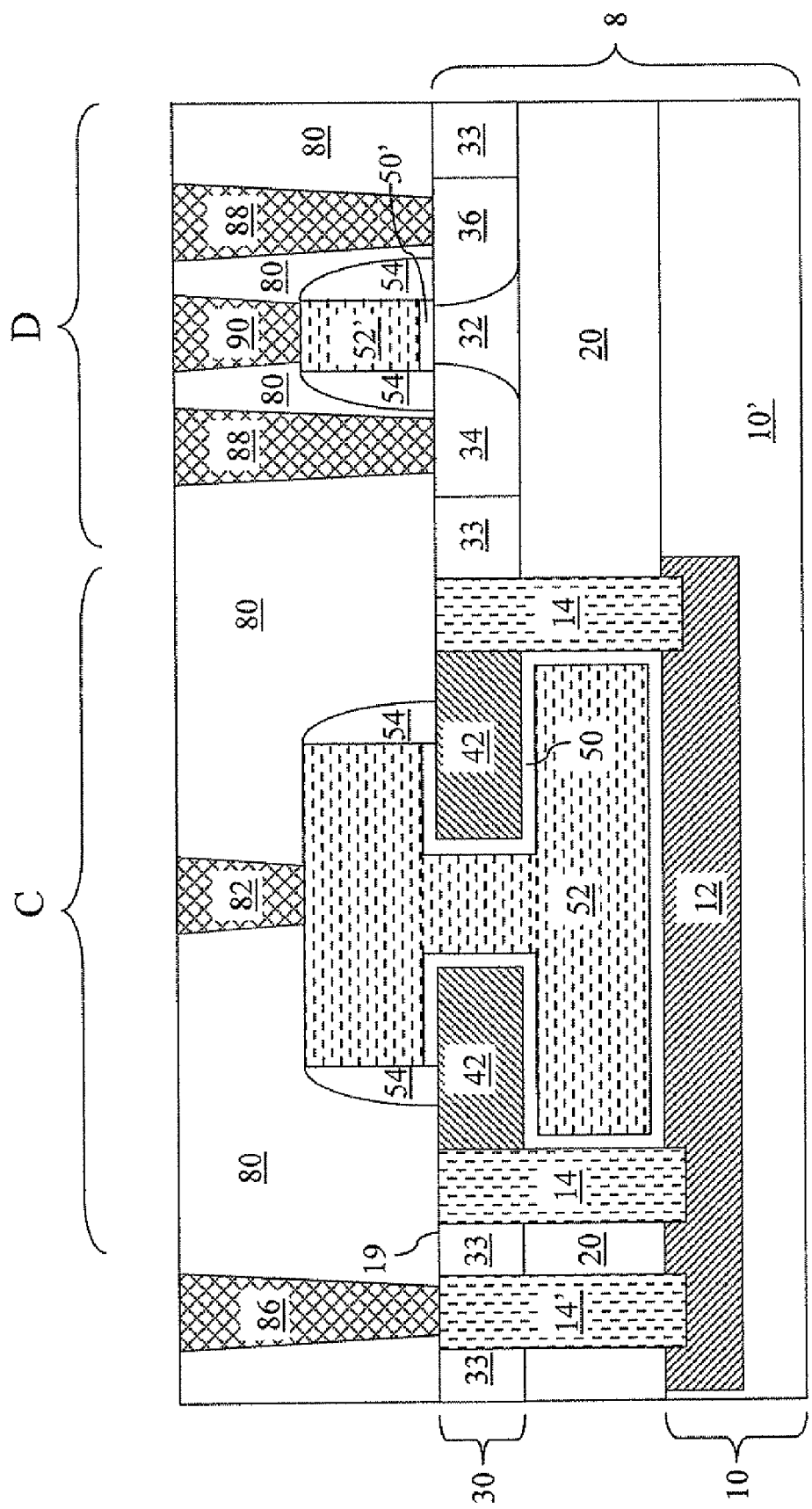
FIG. 16 is a vertical cross-sectional view of a first variation on the exemplary semiconductor structure.

Referring to FIG. 16, a metal contact scheme is altered from the exemplary semiconductor structure in a first variation of the exemplary semiconductor structure. Specifically, the first electrode is not contacted at the doped top semiconductor portion 42 or at the enclosing wall 14. Instead, the doped handle substrate portion 12 is contacted by at least one handle substrate contact plug 14', which is contacted by at least one handle substrate contact via 86.

Figure 17:
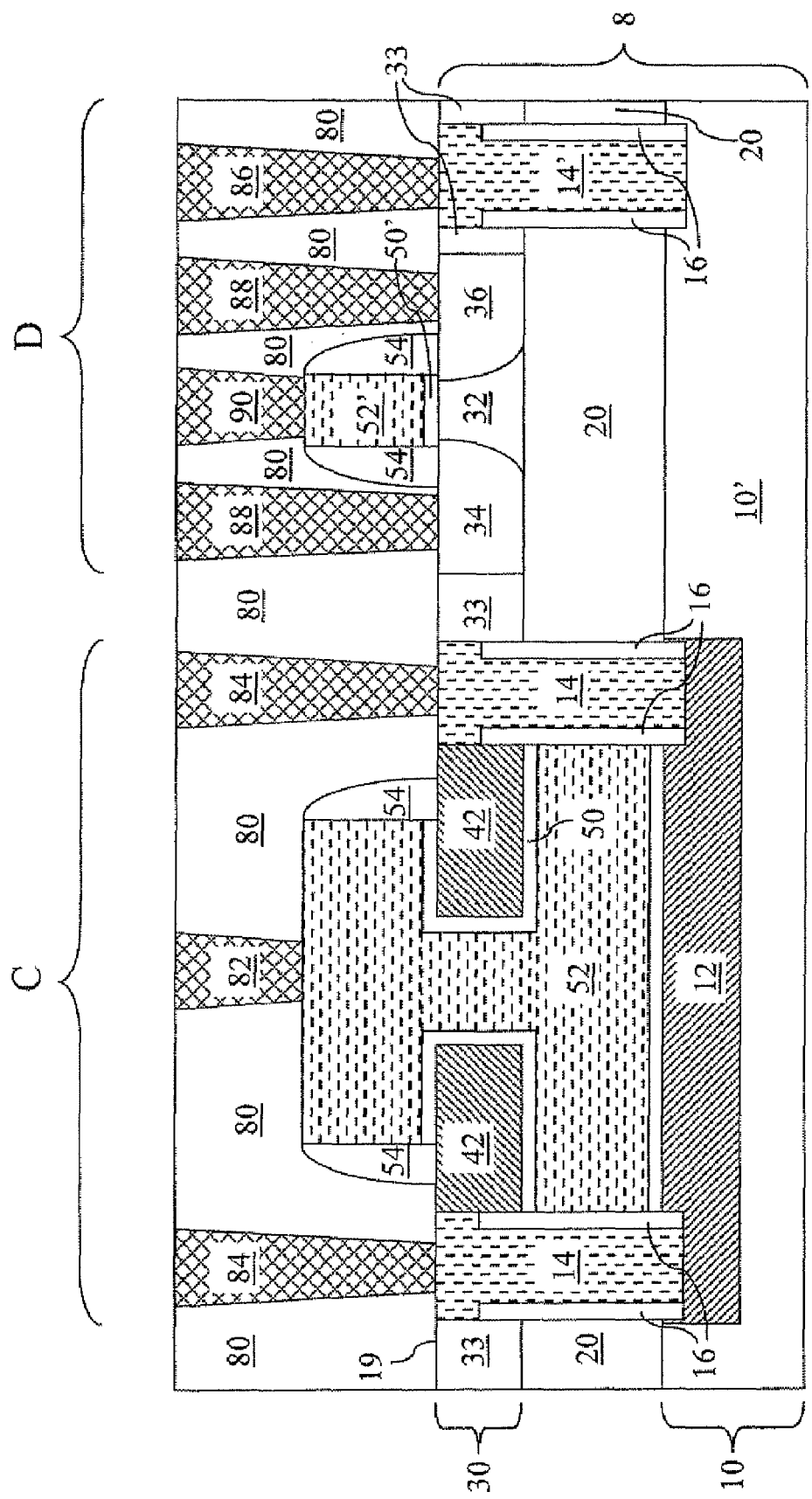
FIG. 17 is a vertical cross-sectional view of a second variation on the exemplary semiconductor structure.

Referring to FIG. 17, a second variation of the exemplary semiconductor structure comprises an enclosing wall 14 comprising a first conductive material and dielectric trench spacers 16. After formation of the closed line trench 13 and the at least one handle substrate contact hole 13' corresponding to a processing step of FIGS. 6 and 7, dielectric trench spacers 16 are formed on the sidewalls of the closed line trench 13 and the at least one handle substrate contact hole 13' by a conformal deposition of a dielectric layer (not shown) and a reactive ion etch. The reactive ion etch removes horizontal portions of the dielectric layer. Preferably, top surfaces of the dielectric trench spacers 16 are recessed below the top surface 19 of the SOI substrate so that the enclosing wall 14 electrically contacts the doped top semiconductor portion 42. The dielectric trench spacers 16 comprise a dielectric material such as silicon oxide or silicon nitride.

The first conductive material may be a metallic material. The metallic material may comprise an elemental metal such as Ta, Ti, W, Co, Ni, Pt, Au, Ag, etc., or a metallic nitride compound such as TaN, TiN, WN, etc, or a metal silicide such as $CoSi_x$, $NiSi_x$, $WSi_x$, $PtSi_x$, etc., wherein the value of x is from about 1 to about 3. The metallic material may be formed by chemical vapor deposition (CVD), physical vapor deposition (PVD), electroplating or electroless plating, or a combination thereof. Residual metallic material above the top surface of the SOI substrate 8 is removed, for example, by an etch, chemical mechanical planarization, or a combination of both. The remaining portions of the metallic material in the closed line trench constitutes the enclosing wall 14, and the remaining portions of the metallic material in the at least one handle substrate contact hole 13' constitutes the at least one handle substrate contact plug 14'. The dielectric trench spacers 16 provide electrical isolation between the enclosing wall and the second electrode 52.

Figure 18:
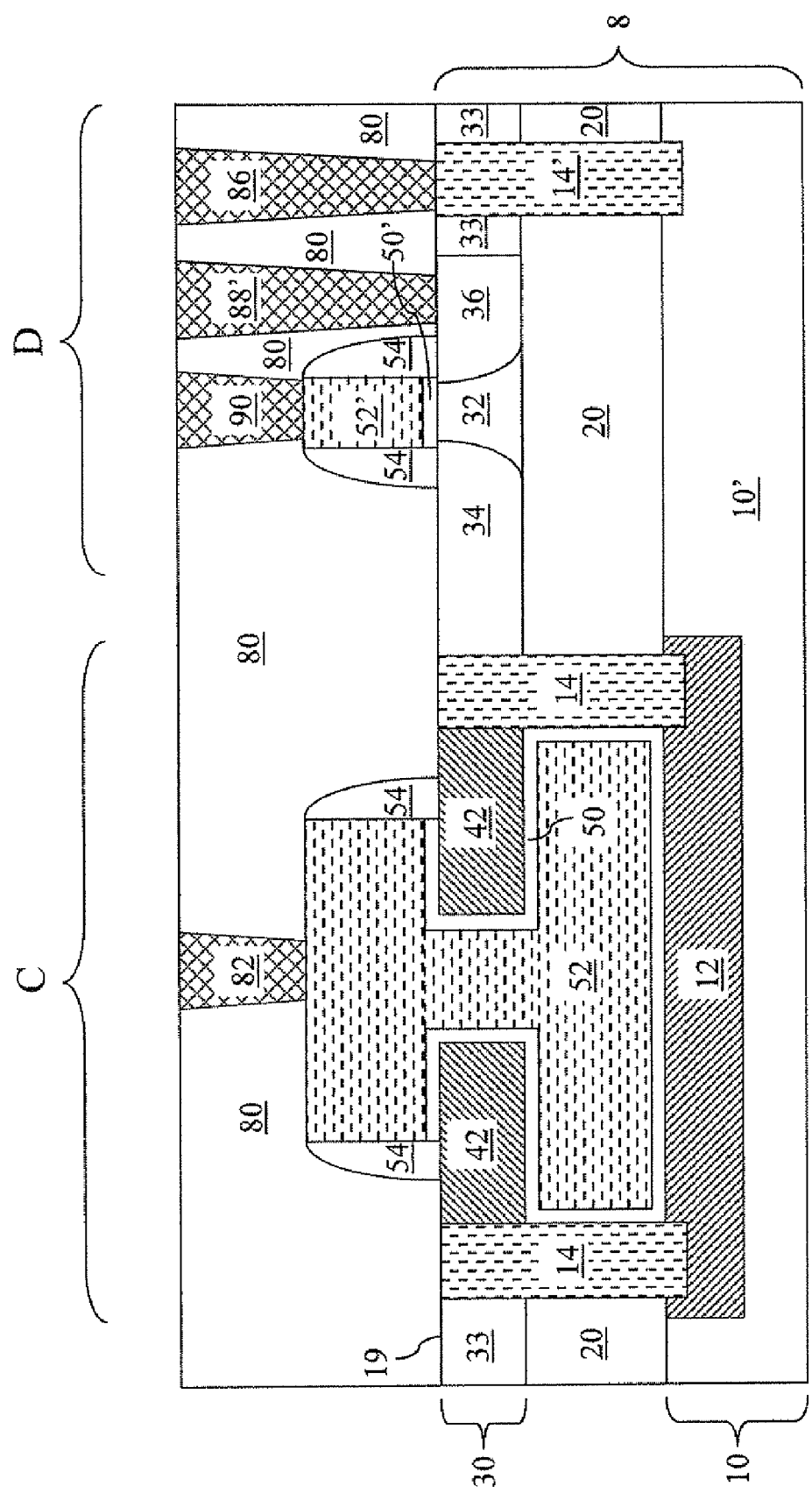
FIG. 18 is a vertical cross-sectional view of a third variation on the exemplary semiconductor structure.

Referring to FIG. 18, a third variation of the exemplary semiconductor structure comprises memory, for example, a dynamic random access memory (DRAM) cell comprising an access transistor located in the device region D and a capacitor located in the capacitor region. The first electrode of the capacitor is contacted at an outer sidewall of the enclosing wall by the source region 34 of the access transistor. At least one handle substrate contact plug 14' and at least one handle substrate contact via 86 are employed to bias the handle semiconductor portion 10', which has a doping of the first conductivity type, to reverse bias the doped handle substrate portion 12, which has a doping of the second conductivity type, and provide electrical isolation of the first electrode. The second electrode 52 is biased through the second electrode contact via 82. The drain contact via 88' is connected to a bit line. The gate conductor 52 runs in a line to function as a word line, and contacted by a gate contact via 90 that provides a word line control voltage to the gate conductor 52.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising a first electrode, a capacitor dielectric, and a second electrode,
    wherein said first electrode includes:
        a doped top semiconductor portion comprising a doped first semiconductor material, containing a vertical hole therein, and located in a top semiconductor layer of a semiconductor-on-insulator (SOI) substrate;
        an enclosing wall having a volume, comprising a first conductive material, encircling said doped top semiconductor portion, and contacting a handle substrate of said SOI substrate; and
        a doped handle substrate portion comprising a doped second semiconductor material and located in said handle substrate;
    and wherein said capacitor dielectric is located directly on said first electrode;
    and wherein said second electrode comprises a second conductive material and located directly on said capacitor dielectric.

2. The semiconductor structure of claim 1, wherein said capacitor dielectric is located on a top surface of said doped handle substrate portion, a bottom surface of said doped top semiconductor portion, an entirety of sidewalls of said hole, and a top surface of said doped top semiconductor portion.

3. The semiconductor structure of claim 2, wherein said capacitor dielectric is located on inner surfaces of said enclosed sidewall, and wherein said capacitor dielectric is of unitary construction.

4. The semiconductor structure of claim 1, wherein said doped top semiconductor portion and said doped handle substrate portion comprise doped single crystalline silicon, and wherein said enclosing wall comprises a metallic material or another doped semiconductor material.

5. The semiconductor structure of claim 4, wherein said enclosing wall comprises said another doped semiconductor material, and wherein doping conductivity types of said doped single crystalline silicon and said another doped semiconductor material are the same.

6. The semiconductor structure of claim 1, wherein said capacitor dielectric comprises one of a silicon oxide containing dielectric material or a high-k gate dielectric material.

7. The semiconductor structure of claim 1, wherein said doped top semiconductor portion is topologically homeomorphic to a torus, and wherein said enclosing wall is topologically homeomorphic to a torus.

8. The semiconductor structure of claim 1, wherein said enclosing wall extends from a top surface of said top semiconductor layer through a buried insulator layer to said doped handle substrate portion.

9. The semiconductor structure of claim 1, further comprising a handle substrate contact plug comprising said first conductive material and extending from a top surface of said top semiconductor layer through a buried insulator layer to said handle substrate.

10. The semiconductor structure of claim 1, further comprising a field effect transistor located on said top semiconductor layer and including a gate conductor containing said second conductive material.

11. The semiconductor structure of claim 1, further comprising a shallow isolation trench structure laterally abutting said enclosing wall and vertically abutting a buried insulator layer.

12. The semiconductor structure of claim 1, further comprising at least one contact via vertically abutting said second electrode and at least another contact via vertically abutting at least one of said doped top semiconductor portion or said enclosing wall.

13. The semiconductor structure of claim 1, further comprising a field effect transistor including a source region, wherein said source region laterally abuts said enclosing wall.

* * * * *